United States Patent
Nakao et al.

(10) Patent No.: US 10,785,576 B1
(45) Date of Patent: Sep. 22, 2020

(54) MEMS PACKAGE, MEMS MICROPHONE, METHOD OF MANUFACTURING THE MEMS PACKAGE AND METHOD OF MANUFACTURING THE MEMS MICROPHONE

(71) Applicant: SAE Magnetics (H.K.) Ltd., Hong Kong (HK)

(72) Inventors: Akio Nakao, Hong Kong (HK); Masashi Shiraishi, Hong Kong (HK)

(73) Assignee: SAE Magnetics (H.K.) Ltd., Hong Kong (HK)

( * ) Notice: Subject to any disclaimer, the term of this patent is extended or adjusted under 35 U.S.C. 154(b) by 0 days.

(21) Appl. No.: 16/398,301

(22) Filed: Apr. 30, 2019

(51) Int. Cl.
*H04R 19/04* (2006.01)
*B81B 7/00* (2006.01)
*B81C 1/00* (2006.01)
*H04R 31/00* (2006.01)
*H04R 19/00* (2006.01)
*H04R 1/04* (2006.01)

(52) U.S. Cl.
CPC .......... *H04R 19/04* (2013.01); *B81B 7/0061* (2013.01); *B81C 1/00309* (2013.01); *H04R 1/04* (2013.01); *H04R 19/005* (2013.01); *H04R 31/003* (2013.01); *B81B 2201/0257* (2013.01); *B81B 2207/012* (2013.01); *B81C 2203/019* (2013.01); *B81C 2203/035* (2013.01); *H04R 2201/003* (2013.01)

(58) Field of Classification Search
CPC .............. H04R 19/005; H04R 19/04; H04R 2201/003; B81B 7/0061; B81B 2201/0257
USPC ...... 381/174, 175, 369; 257/416; 435/51, 53
See application file for complete search history.

(56) References Cited

U.S. PATENT DOCUMENTS

| | | | |
|---|---|---|---|
| 8,816,453 B2 | 8/2014 | Zoellin et al. | |
| 2009/0001553 A1* | 1/2009 | Pahl | B81B 7/0064 257/704 |
| 2014/0306299 A1* | 10/2014 | Kasai | B81B 3/0027 257/416 |

FOREIGN PATENT DOCUMENTS

| JP | 2012-114672 A | 6/2012 |
|---|---|---|
| JP | 2016-523725 A | 8/2016 |
| JP | 2017-522814 A | 8/2017 |

* cited by examiner

*Primary Examiner* — Fan S Tsang
*Assistant Examiner* — Julie X Dang

(57) ABSTRACT

A MEMS package has a MEMS chip, a package substrate, a dammed-seal part. The MEMS chip has an element substrate which a movable element is formed, the package substrate has a sound hole. The dammed-seal part has an annular dam-member which is formed on the element substrate so as to surround the movable element, and a gel member. The MEMS chip is mounted on the package substrate so that the movable element opposes to the sound hole. The gel member is formed by hardening of gel which is applied on the annular dam-member from outside so as to surround the annular dam-member.

7 Claims, 20 Drawing Sheets

MEMS PACKAGE, MEMS MICROPHONE, METHOD OF MANUFACTURING THE MEMS PACKAGE AND METHOD OF MANUFACTURING THE MEMS MICROPHONE

BACKGROUND

Field of the Invention

The present invention relates to a MEMS package which a MEMS chip, being used as a microphone, a sensor and so on, is mounted on a package substrate, a MEMS microphone having the MEMS package, method of manufacturing the MEMS package, and method of manufacturing the MEMS microphone.

Related Background Art

A minute device, which is called MEMS (Micro Electro Mechanical Systems), is conventionally known. The MEMS is a device which a minute movable element and an electronic circuit are integrated on a substrate (which is also called element substrate) made of silicon and so on. Because the whole of the MEMS is formed in a chip-like form, the MEMS is also called a MEMS chip, in the present invention. The MEMS chip is used as a microphone, sensor, actuator and so on.

For example, the MEMS chip, which is used as the microphone, has a membrane being a thin-film and electrodes made of one or two thin-film arranged in the neighborhood of the membrane, and the MEMS chip has a structure which a concave part, for arranging the membrane, is formed. In case of the MEMS chip, which is used as the microphone of capacitance-type, displacement of the membrane, in accordance with sound pressure, is detected as displacement of capacitance between the electrodes. Therefore, the MEMS chip, which is used as the microphone of capacitance-type, operates with the principle of a variable capacitor.

Then, concerning the MEMS package which the MEMS chip is mounted on the package substrate, the following two structures are conventionally known. The one is a structure which the MEMS chip is mounted on the package substrate by a FCB (Flip Chip Bonding), for example see JP2016-523725 (also called patent document 1), and the other is a structure which the MEMS chip is mounted on the package substrate by a Wire Bonding (for example, see JP2012-114672 (also called patent document 2)).

SUMMARY OF THE INVENTION

By the way, in case of the MEMS package, which is used as the microphone, it is important that the sound, entered from outside, reaches the membrane. As the structure for the-above, the following bottom-port structure is conventionally known.

The bottom-port structure means the structure which sound holes are formed on both the package substrate and a motherboard, which the package substrate is mounted (for example, see JP2017-522814 (also called patent document 3), U.S. Pat. No. 8,816,453 (also called patent document 4)).

Then, as the MEMS package having the bottom-port structure, for example, a MEMS package 710, illustrated in FIG. 19, FIG. 20, is conventionally known.

The MEMS package 710 has a cap 701, a MEMS chip 702, an ASIC 703 and a package substrate 704. The MEMS chip 702 is mounted on the package substrate 704 by the FCB with solder bumps 706. Further, a concave part 702c is formed in the MEMS chip 702, the membrane, not illustrated, is arranged inside the concave part 702c. A sound hole 704b is formed in the package substrate 704. A seal part 705, made of adhesive, is formed on the package substrate 704 so as to surround the sound hole 704b. The part, from the sound hole 704b to the MEMS chip 702, is sealed by the seal part 705. In the present invention, the structure, that the seal part is formed to surround the sound hole of the package substrate, is also called "bottom-seal structure", like the MEMS package 710.

Then, in the MEMS package 710, the solder bumps 706 are used. As illustrated in FIG. 20, the solder bumps 706 are arranged in the parts of the MEMS chip 702. Therefore, adhesive, which is used for forming the seal part 705, enters the inside of the MEMS chip 702 than the solder bumps 706 (see FIG. 20). Therefore, the seal part 705 spreads to the inside of the solder bumps 706. Thereby, a front volume (also referred to front chamber) is narrowed. Then, acoustic characteristic is lowered.

At this point, if the adhesive does not enter the inside of the solder bumps 706, lowering the acoustic characteristic is avoided.

However, the member, which prevents entering of the adhesive, is necessary on the surface, of the MEMS chip 702, of the solder bumps 706 side, because of that. Then, because it brings complication of the structure of the MEMS package 710, it is difficult that the MEMS package 710 is manufactured certainly.

As described above, it is extremely difficult that the conventional MEMS package, having the bottom-seal structure, and moreover the structure, which the acoustic characteristic is not lowered, is manufactured certainly.

Hence the present invention is made to solve the above problem, and it is an object to provide the MEMS package, the MEMS microphone, having the bottom-seal structure and the structure, which the acoustic characteristic is not lowered, and can be manufactured certainly, and method of manufacturing the MEMS package and method of manufacturing the MEMS microphone.

To solve the above problem, the present invention is a MEMS package, including: a MEMS chip; a package substrate which the MEMS chip is adhered; and a dammed-seal part, the MEMS chip comprises an element substrate which a movable element is formed, the package substrate comprises a sound hole, the dammed-seal part includes an annular dam-member which is formed on the element substrate so as to surround the movable element, and a gel member, the MEMS chip is mounted on the package substrate so that the movable element opposes to the sound hole, the gel member is formed by hardening of gel which is applied on the annular dam-member from outside so as to surround the annular dam-member.

Further, in case of the above-described MEMS package, it is possible that the dammed-seal part is formed so as to seal the part between the MEMS chip and the package substrate, and so as to surround the sound hole.

Further, in case of the above-described MEMS package, it is preferable that the annular dam-member includes a dam outer end surface, which is along with an opposing surface, of the element substrate, opposing to package substrate, a dam base surface, which is in contact with the opposing surface, a pair of dam slopes, which connects the dam outer end surface and the dam base surface, and a variable width structure in which the width gradually increases toward the dam base surface from the dam outer end surface.

Further, it is preferable that the gel member is in contact with both the dam outer end surface of the annular dam-member and an outer dam slope, arranged outside, of the pair of the dam slopes, and the gel member enters a dam space being formed between the dam outer end surface and the package substrate.

Then, the present invention provides a MEMS microphone including: a MEMS package; and a cap which wraps the MEMS package, the MEMS package comprises a MEMS chip, a package substrate which the MEMS chip is adhered, and a dammed-seal part, the MEMS chip includes an element substrate which a movable element is formed, the package substrate comprises a sound hole, the dammed-seal part comprises an annular dam-member which is formed on the element substrate so as to surround the movable element, and a gel member, the MEMS chip is mounted on the package substrate so that the movable element opposes to the sound hole, the gel member is formed by hardening of gel which is applied on the annular dam-member from outside so as to surround the annular dam-member.

In case of the above-described MEMS microphone, it is preferable that the dammed-seal part is formed so as to seal the part between the MEMS chip and the package substrate, and so as to surround the sound hole, the MEMS microphone further including a front volume, which is surround by the movable element of the element substrate and the package substrate.

Further, it is preferable that the annular dam-member includes a dam outer end surface, which is along with an opposing surface, of the element substrate, opposing to package substrate, a dam base surface, which is in contact with the opposing surface, a pair of dam slopes, which connects the dam outer end surface and the dam base surface, and a variable width structure in which the width gradually increases toward the dam base surface from the dam outer end surface, the gel member is in contact with both the dam outer end surface of the annular dam-member and an outer dam slope, arranged outside, of the pair of the dam slopes, and the gel member enters a dam space being formed between the dam outer end surface and the package substrate.

Further, the present invention provides a method of manufacturing a MEMS package, using a MEMS chip, an ASIC and a package substrate including: an annular dam-member forming step for forming an annular dam-member having an annular structure which surrounds a movable element formed in each MEMS region of a MEMS wafer, having a plurality of the MEMS regions for forming the MEMS chip; a MEMS chip manufacturing step for manufacturing a plurality of dam-MEMS chips by dividing a dam-MEMS wafer, which the annular dam-members are formed, into the respective MEMS regions; a mounting step for mounting the dam-MEMS chips and the ASICs on the respective package regions, for forming the package substrates, of a package-panel which a plurality of package regions are formed; and a gel member forming step for forming a gel member by applying gel on the annular dam-member in each of the package regions of the package-panel and hardening of the gel, the annular dam-member mounting step is performed so that the annular dam-member is formed on an element formed surface, of each of the MEMS regions, which the movable element is formed, the mounting step is performed so that a sound hole-panel, which the sound holes are formed in the respective package regions, is used as the package-panel, and the annular dam-members of the dam-MEMS chips surround the sound holes formed in the respective package regions.

In case of the above-described method of manufacturing the MEMS package, it is preferable that the gel member forming step is performed so that the gel surrounds the annular dam-member of the dam-MEMS chip from outside.

Further, it is preferable that the mounting step is performed so that a dam space, which the gel is able to enter, is secured between a dam outer end surface, of the annular dam-member, arranged distant from the dam-MEMS chip and the package substrate.

Further, it is preferable that the annular dam-member forming step has a dam layer forming step for forming a dam layer by an ink application for applying ink according to ink jet system, and an ink hardening for hardening the ink applied by the ink application, the dam layer forming step is performed repeatedly, thereby a laminated dam layer, which the dam layer is laminated, is formed as the annular dam-member.

Further, the present invention provides a method of manufacturing the MEMS microphone, using a MEMS chip, an ASIC, a package substrate and cap including: an annular dam-member forming step for forming an annular dam-member having an annular structure which surrounds a movable element formed in each MEMS region of a MEMS wafer, having a plurality of the MEMS regions for forming the MEMS chip; a MEMS chip manufacturing step for manufacturing a plurality of dam-MEMS chips by dividing a dam-MEMS wafer, which the annular dam-members are formed, into the respective MEMS regions; a mounting step for mounting the dam-MEMS chips and the ASICs on the respective package regions, for forming the package substrates, of a package-panel which a plurality of package regions are formed; a gel member forming step for forming a gel member by applying gel on the annular dam-member in each of the package regions of the package-panel and hardening of the gel; and a cap mounting step for mounting the cap on each of the package regions of the package-panel, the annular dam-member mounting step is performed so that the annular dam-member is formed on an element formed surface, of each of the MEMS regions, which the movable element is formed, the mounting step is performed so that a sound hole-panel, which the sound holes are formed in the respective package regions, is used as the package-panel, and the annular dam-members of the dam-MEMS chips surround the sound holes formed in the respective package regions.

In case of the above-described method of manufacturing the MEMS microphone, it is preferable that the gel member forming step is performed so that the gel surrounds the annular dam-member of the dam-MEMS chip from outside.

The present invention will be more fully understood from the detailed description given hereinbelow and the accompanying drawings which are given by way of illustration only, and thus are not to be considered as limiting the present invention.

DETAILED DESCRIPTION OF THE EMBODIMENTS

In the following, embodiments of the present invention will be described with reference to the drawings. Note that the same components will be referred to with the same numerals or letters, while omitting their overlapping descriptions.

(Structure of the MEMS Package, MEMS Microphone)

To begin with, the structure of a MEMS package 1, a MEMS microphone 100, according to the embodiment of the present invention will be explained with reference to FIG. 1 to FIG. 2.

Figure 1:
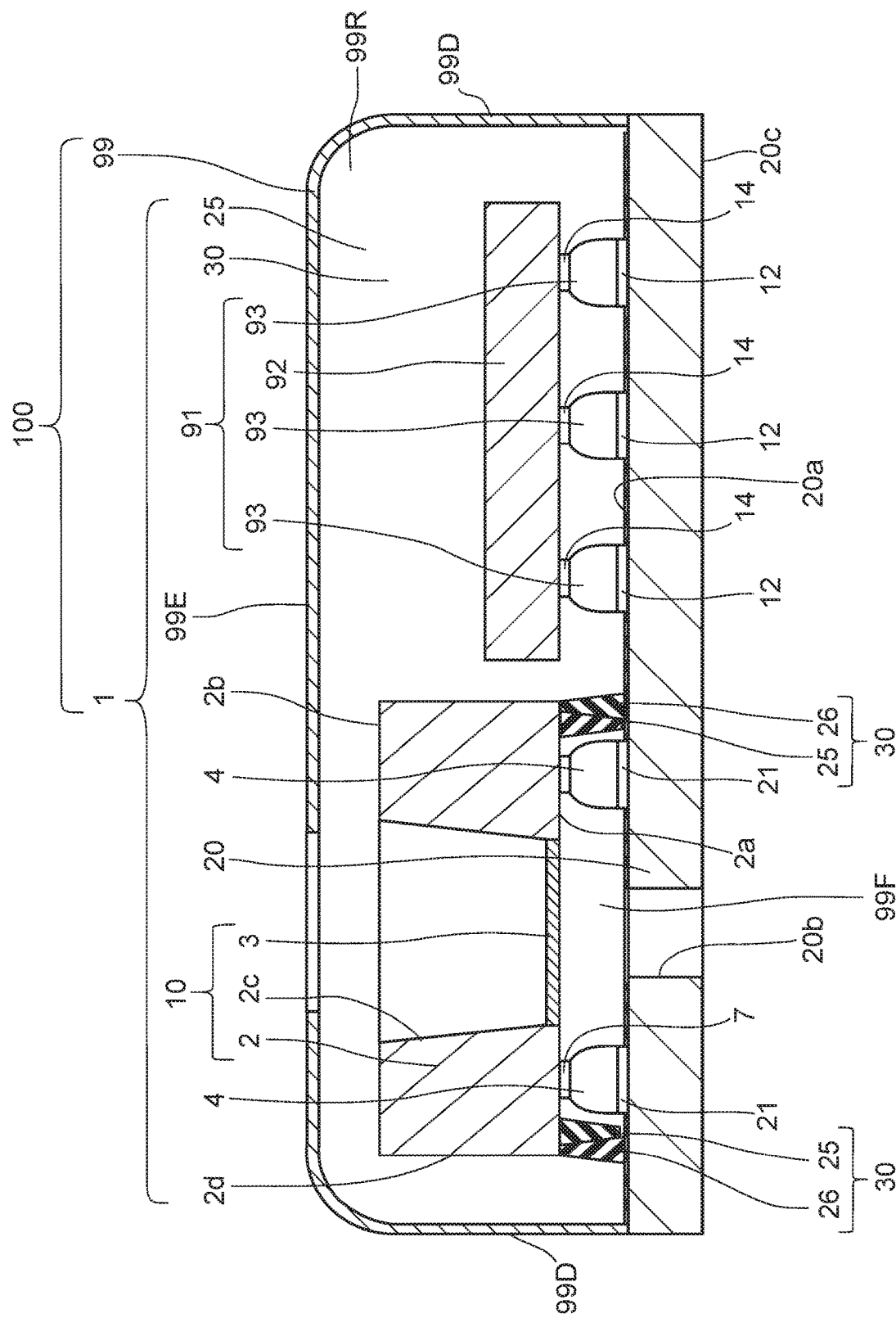
FIG. 1 is a sectional view, of a part corresponding to the line 1-1 in FIG. 2, showing a MEMS microphone according to the embodiment of the present invention.
Figure 2:
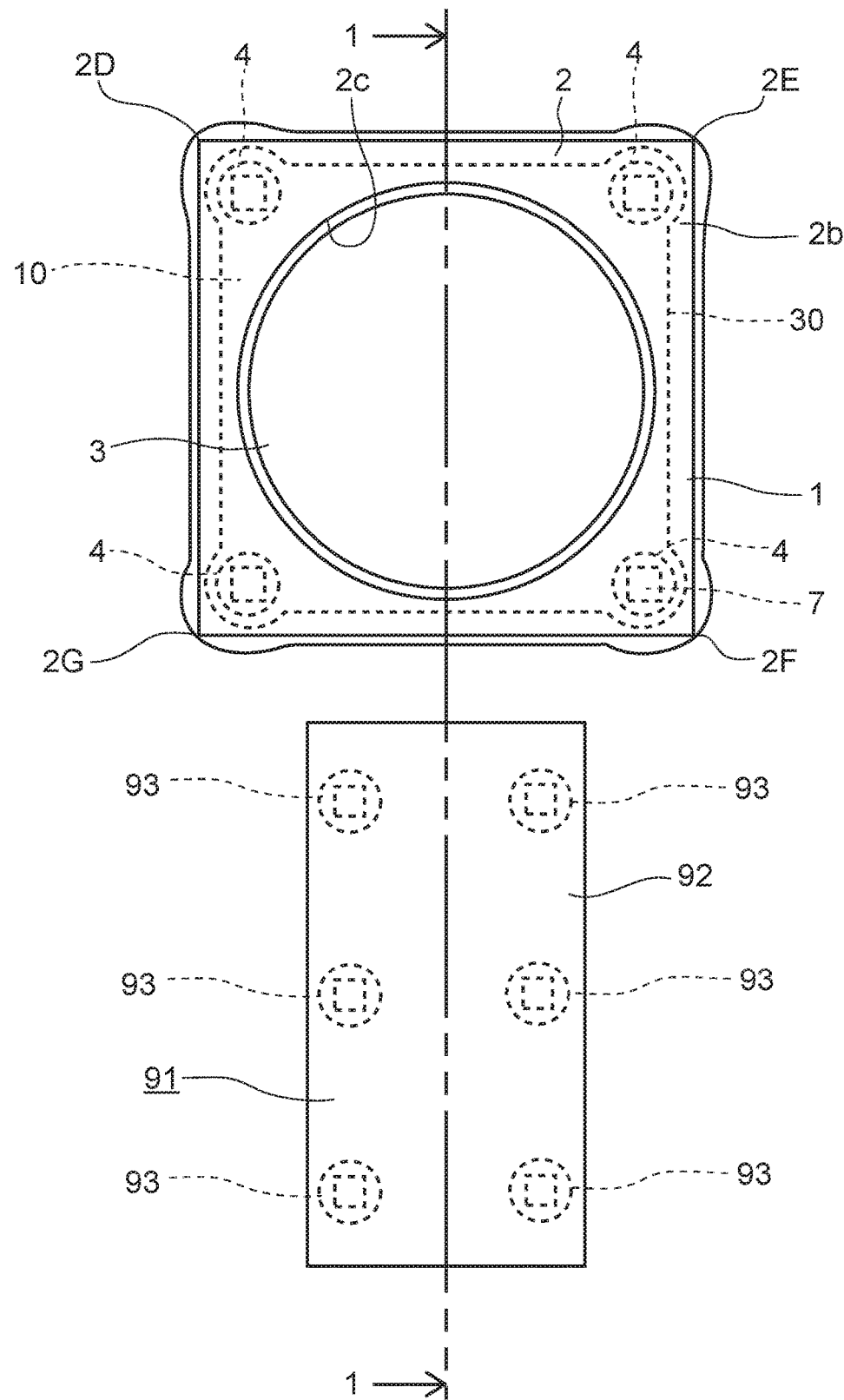
FIG. 2 is a plan view showing a principal part of a MEMS package according to the embodiment of the present invention.

Here, FIG. 1 is a sectional view, of a part corresponding to the line 1-1 in FIG. 2, showing the MEMS microphone 100 according to the embodiment of the present invention. FIG. 2 is a plan view showing a principal part of the MEMS package 1.

As illustrated in FIG. 1, the MEMS microphone 100 has the MEMS package 1 and a cap 99.

The MEMS package 1 has a MEMS chip 10, a package substrate 20, which the MEMS chip 10 is adhered, bonding bumps 4, a dammed-seal part 30 and an ASIC package 91. The MEMS chip 10 and an ASIC 92 are mounted on the package substrate 20 by the FCB, in the MEMS package 1.

The MEMS chip 10 has an element substrate 2 which a membrane 3, as a movable element, is formed. The MEMS chip 10 is used as the microphone of capacitance-type. The element substrate 2 is a substrate formed in a rectangular-shape in a plan view, as illustrated in FIG. 2, and it has a side surface 2d. The element substrate 2 is formed with silicon. An element hole-part 2c is formed in the center of the element substrate 2. The element hole-part 2c is formed in a cylindrical-shape from a chip surface 2b (outside surface of the element substrate 2) of the element substrate 2 to an opposing surface 2a (the surface of the element substrate 2, opposing to the package substrate 20), and the membrane 3 is arranged in the opposing surface 2a side of the element hole-part 2c. Note that two thin-films, which are called back-plates (not illustrated), are arranged in the upper side and the lower side of the membrane 3.

The membrane 3 is vibration film formed approximately in a circular-shape, and it is a thin-film made of an inorganic metal such as $SiO_2$, SiN or the like.

The bonding bumps 4 are solder bumps made of solder. As illustrated in FIG. 1, the bonding bumps 4 are adhered to both the MEMS chip 10 and the package substrate 20. Namely, the bonding bumps 4 are adhered respectively to electrode pads 7, formed in the opposing surface 2a, and electrode pads 21 formed in a package surface 20a (surface of the MEMS chip 10 side of the package substrate 20) of the package substrate 20. The bonding bumps 4 connect the MEMS chip 10 electrically and fixedly to the package substrate 20.

The package substrate 20 is a board like member made of such as silicon, ceramic or the like (or PCB: Printed Circuit Board). The electrode pads 21 and electrode pads 12 are formed on the package surface 20a of the package substrate 20. The package substrate 20 has a sound hole 20b, the electrode pads 21 are arranged so as to surround the sound hole 20b. The MEMS chip 10 is mounted on the part, of the package surface 20a, which the electrode pads 21 are formed, so that the membrane 3 opposes to the sound hole 20b, the ASIC 92 is mounted on the part which the electrode pads 12 are formed.

In the MEMS package 1 and the MEMS microphone 100, the later-described dammed-seal part 30 is formed to be adhered to the opposing surface 2a of the MEMS chip 10 so as to surround the membrane 3. Further, the dammed-seal part 30 is also formed to be adhered to package surface 20a of the package substrate 20, so as to surround the sound hole 20b. The MEMS package 1 and the MEMS microphone 100 have the bottom-seal structure with the dammed-seal part 30. Further, the dammed-seal part 30 is arranged in the outside than the all bonding bumps 4, the dammed-seal part 30 is formed so as to surround the all bonding bumps 4.

The ASIC package 91 has the ASIC 92, and bonding bumps 93. The ASIC 92, for example, is an integral circuit which amplifies an output signal of the MEMS chip 10 (an integral circuit which outputs displacement of a capacitance as displacement of the voltage in the MEMS chip 10). Electrode pads 14 are formed lower side of the ASIC 92. The electrode pads 14 are connected to the electrode pads 12 of the package surface 20a by the bonding bumps 93.

The cap 99 covers the MEMS package 1. The cap 99 is adhered to the package surface 20a with not illustrated adhesive (or by soldering). The MEMS package 1 is accommodated inside the cap 99.

The cap 99 has a top surface 99E and a cap side-surface 99D. The top surface 99E is a part which is formed so as to oppose to the package substrate 20. The cap side-surface 99D is a part which is formed on the peripheral part of the top surface 99E. The cap side-surface 99D surrounds the top surface 99E, and it is adhered to the package substrate 20.

(Dammed-Seal Part)

Figure 3:
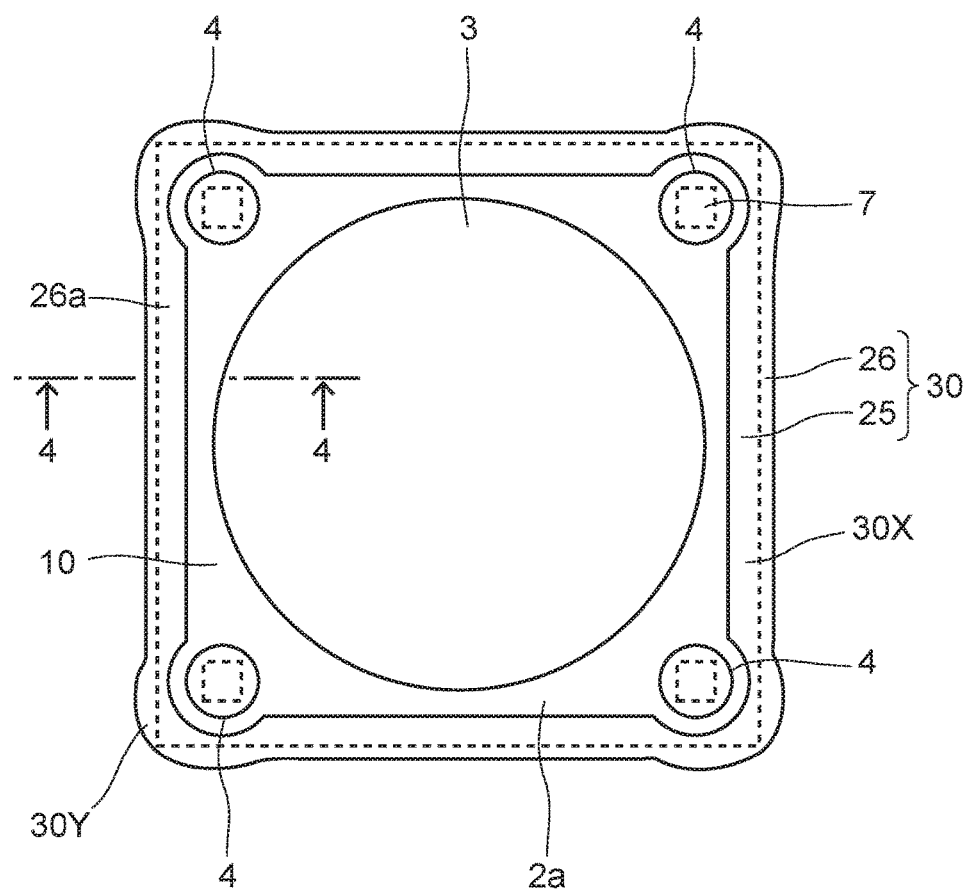
FIG. 3 is a plan view showing an opposing surface side, including a dammed-seal part, of a MEMS chip.
Figure 4:
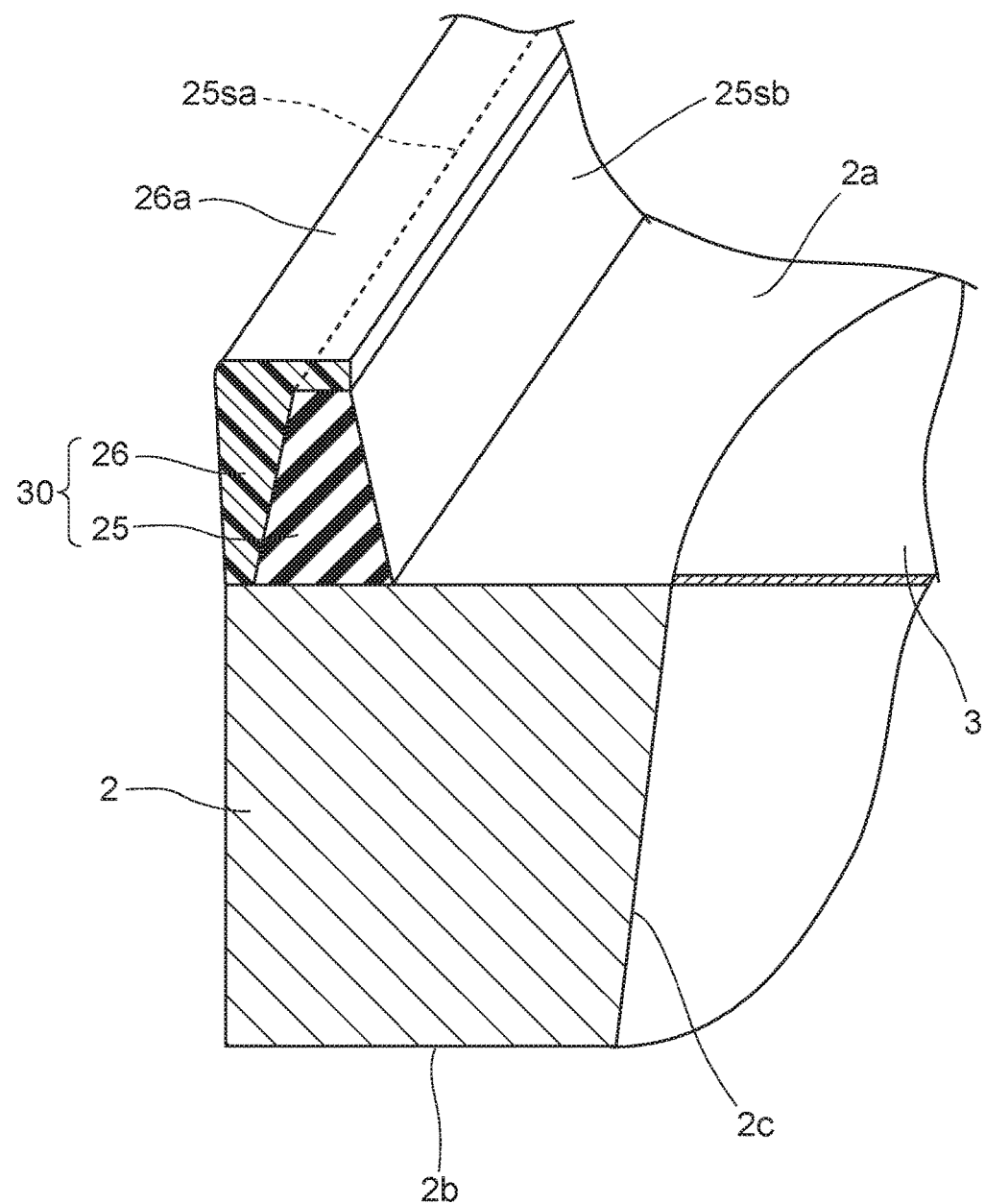
FIG. 4 is a perspective view, partially omitted, showing the MEMS chip and the dammed-seal part, taken along the line 4-4 in FIG. 3.
Figure 5:
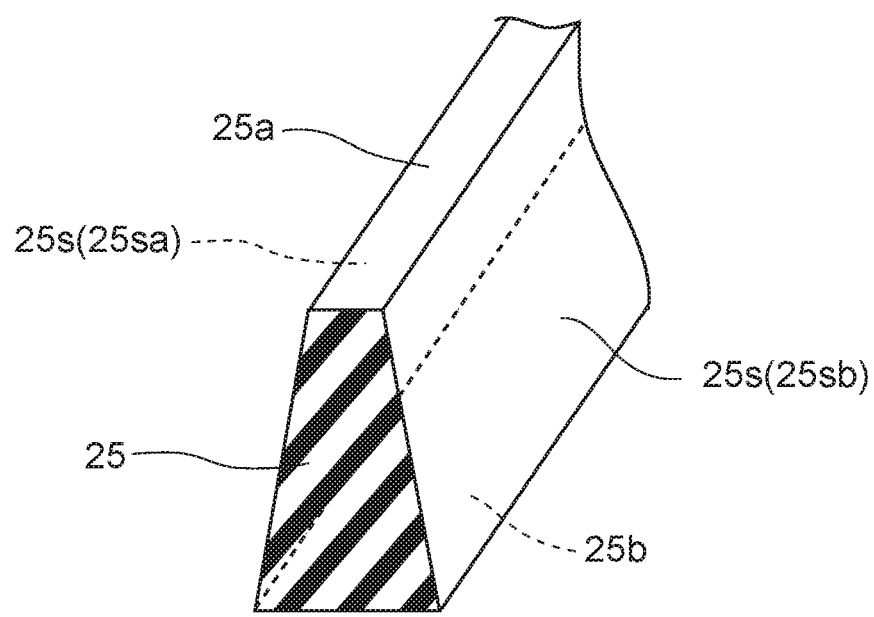
FIG. 5 is a perspective view, partially omitted, showing an annular dam-member, corresponding to FIG. 4.
Figure 6:
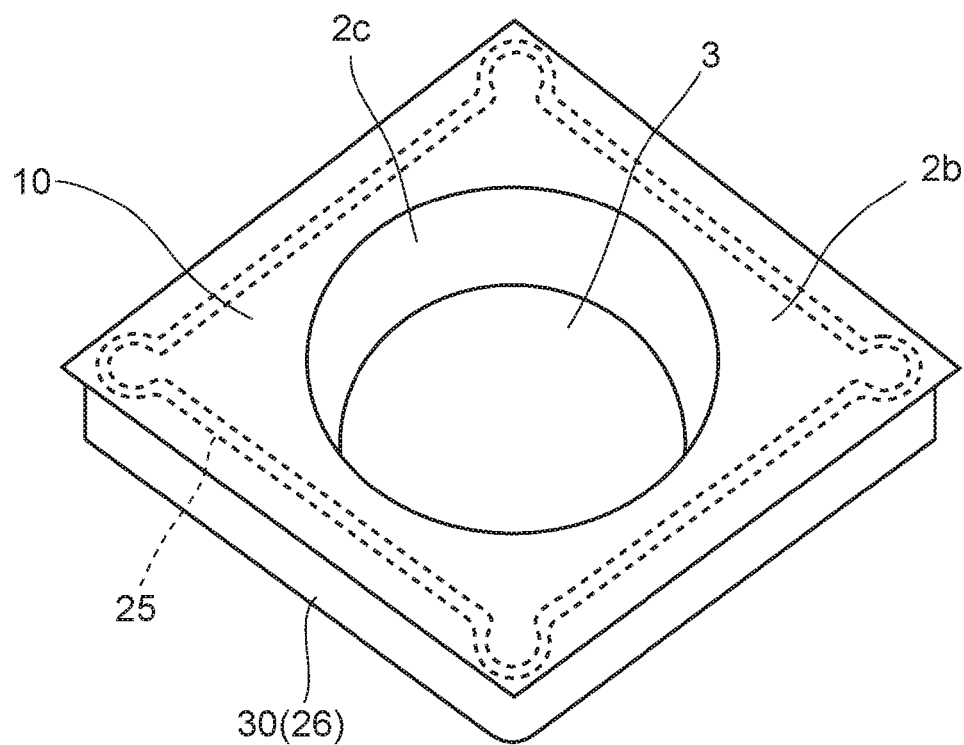
FIG. 6 is a perspective view showing a chip surface side of the MEMS chip.
Figure 7:
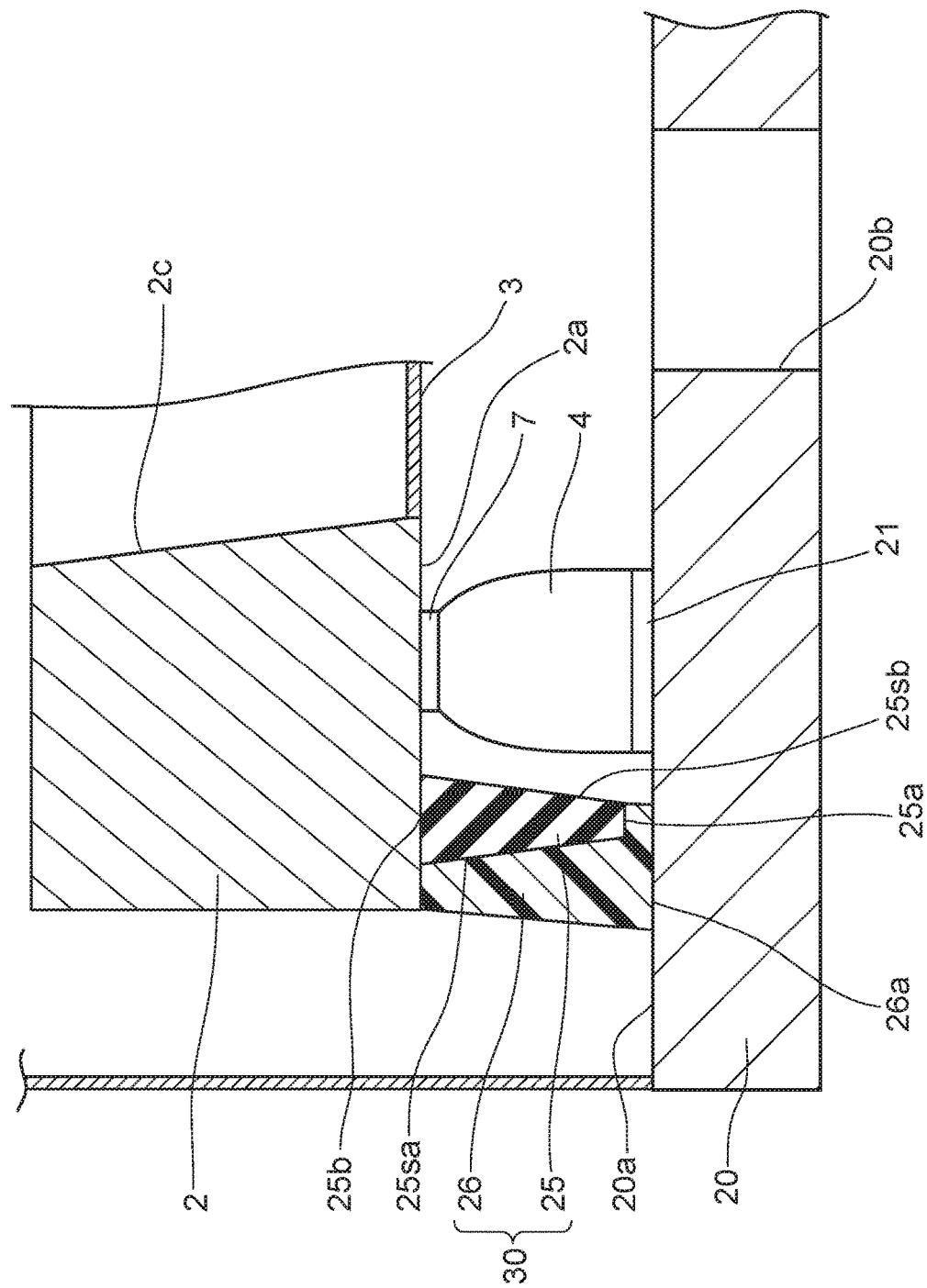
FIG. 7 is a sectional view showing a principal part of FIG. 1.

Subsequently, the dammed-seal part 30 will be explained with reference to FIG. 3 to FIG. 7. Here, FIG. 3 is a plan view showing the opposing surface 2a side, including the dammed-seal part 30, of the MEMS chip 10. FIG. 4 is a perspective view, partially omitted, showing the MEMS chip 10 and the dammed-seal part 30, taken along the line 4-4 in FIG. 3. FIG. 5 is a perspective view, partially omitted, showing an annular dam-member 25, corresponding to FIG. 4. FIG. 6 is a perspective view showing the chip surface 2b side of the MEMS chip 10, FIG. 7 is a sectional view showing a principal part of FIG. 1.

The dammed-seal part 30 has an annular structure, which surrounds the whole of the membrane 3, as illustrated in detail in FIG. 3. As illustrated in FIG. 7, a later-described gel member 26 of the dammed-seal part 30 is adhered to the opposing surface 2a of the MEMS chip 10, and it is also adhered to the package surface 20a of the package substrate 20. Thereby the part between the MEMS chip 10 and the package substrate 20 is sealed by the dammed-seal part 30. Further, a front volume (also called front chamber) 99F is formed in the part from the sound hole 20b to the membrane 3 of the MEMS chip 10.

The dammed-seal part 30 has a plurality of (four, in FIG. 4) straight parts 30X and curved parts 30Y. The dammed-seal part 30 has an annular structure, which the straight parts 30X and the curved parts 30Y are connected alternately, and which is an approximate rectangular shape in a plan view.

Then, as illustrated in FIG. 4, FIG. 5 in detail, the dammed-seal part 30 has the annular dam-member 25 and the gel member 26.

The annular dam-member 25 is formed on the opposing surface 2a so as to surround the whole of the membrane 3, and further so as to surround the all bonding bumps 4.

The annular dam-member 25 has a dam outer end surface 25a, which is along with the opposing surface 2a, a dam base surface 25b, which is in contact with the opposing surface 2a, a pair of dam slopes 25s, which connects the dam outer end surface 25a and the dam base surface 25b. Then, the annular dam-member 25 has a variable width structure in which the width (the width means a width along with the opposing surface 2a) gradually increases toward the dam base surface 25b from the dam outer end surface 25a.

Then, the annular dam-member 25 has an outer dam slope 25sa, which is arranged in the outside being distant from the membrane 3, and an inner dam slope 25sb, which is arranged in the inside being close to the membrane 3, as the pair of dam slopes 25s.

The gel member 26 is a member formed by hardening of gel which is applied on the annular dam-member 25. Gel is obtained by a hardening of colloidal solution into semisolid or solid. As described later, gel, having fluidity, is applied on the annular dam-member 25 in a step of manufacturing the MEMS package 1. After that, the gel becomes solid condition by fluidity loss caused by hardening, thereby the gel member 26 is formed.

The gel member 26 is in contact with both the dam outer end surface 25a and the outer dam slope 25sa. Further, the gel member 26 enters a later-described dam space 27, and the gel member 26 is in also contact with the package surface 20a of the package substrate 20. The annular dam-member 25 has a fixed structure which the form does not change. The gel member 26 is in contact with the annular dam-member 25, as described-above, and it is supported by the annular dam-member 25, thereby the gel member 26 is formed.

As illustrated in FIG. 4, the gel member 26 has a gel surface 26a. The gel surface 26a is an outer surface, of the gel member 26, which is along with the opposing surface 2a. The gel surface 26a is adhered to the package surface 20a of the package substrate 20 so as to surround the whole of the sound hole 20b.

Then, as illustrated in detail in FIG. 1, in the MEMS microphone 100, the above-described front volume 99F and a back volume (also called back chamber) 99R are formed inside the cap 99. The front volume 99F is a space which is surrounded with the dammed-seal part 30, the membrane 3 and the package surface 20a of the package substrate 20. The back volume 99R is a space which is surrounded with the membrane 3, the cap 99 and the package substrate 20.

(Method of Manufacturing the MEMS Package 1, MEMS Microphone 100)

Figure 8:
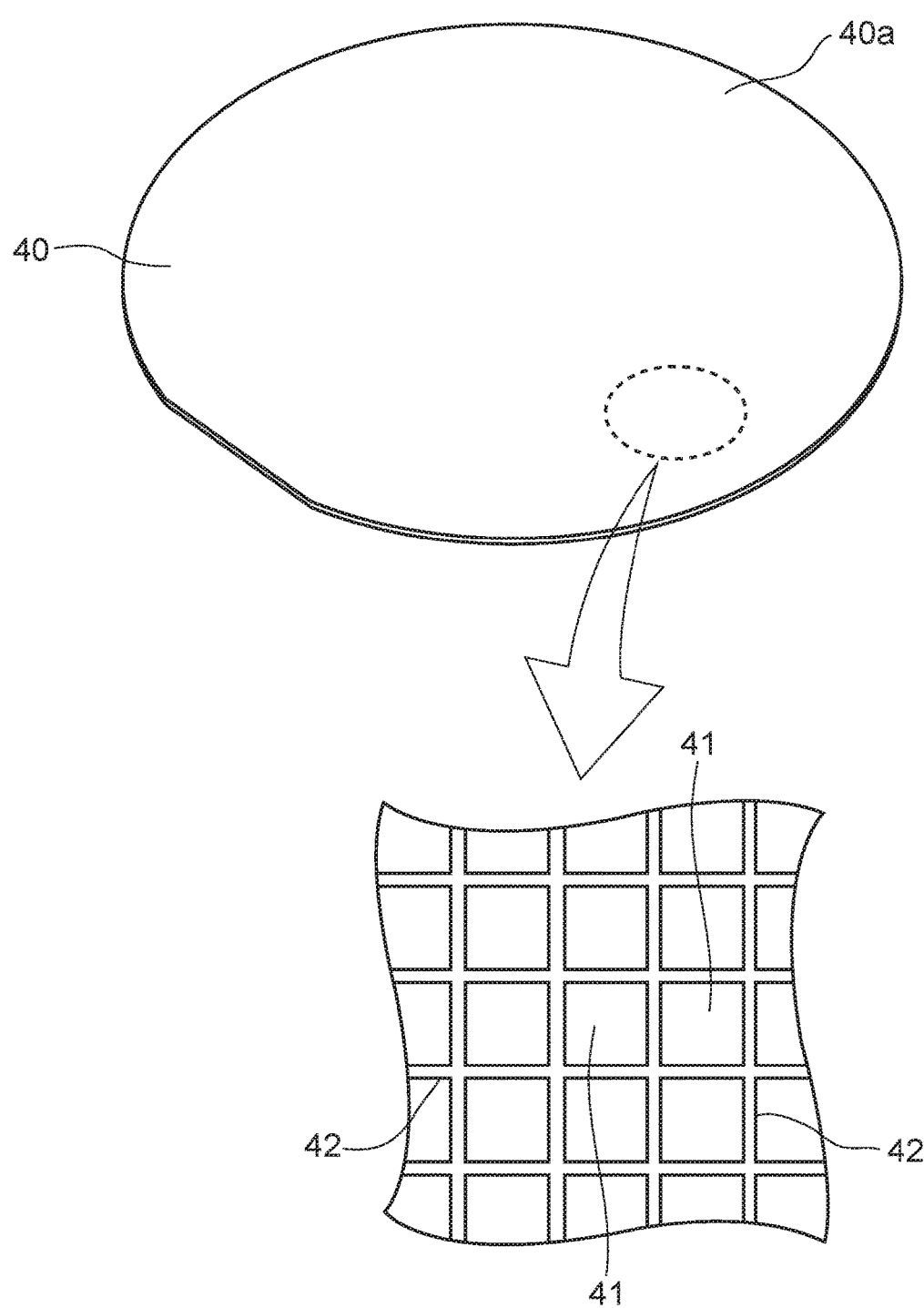
FIG. 8 is a perspective view showing a MEMS wafer used for a manufacturing method according to the embodiment of the present invention.
Figure 9:
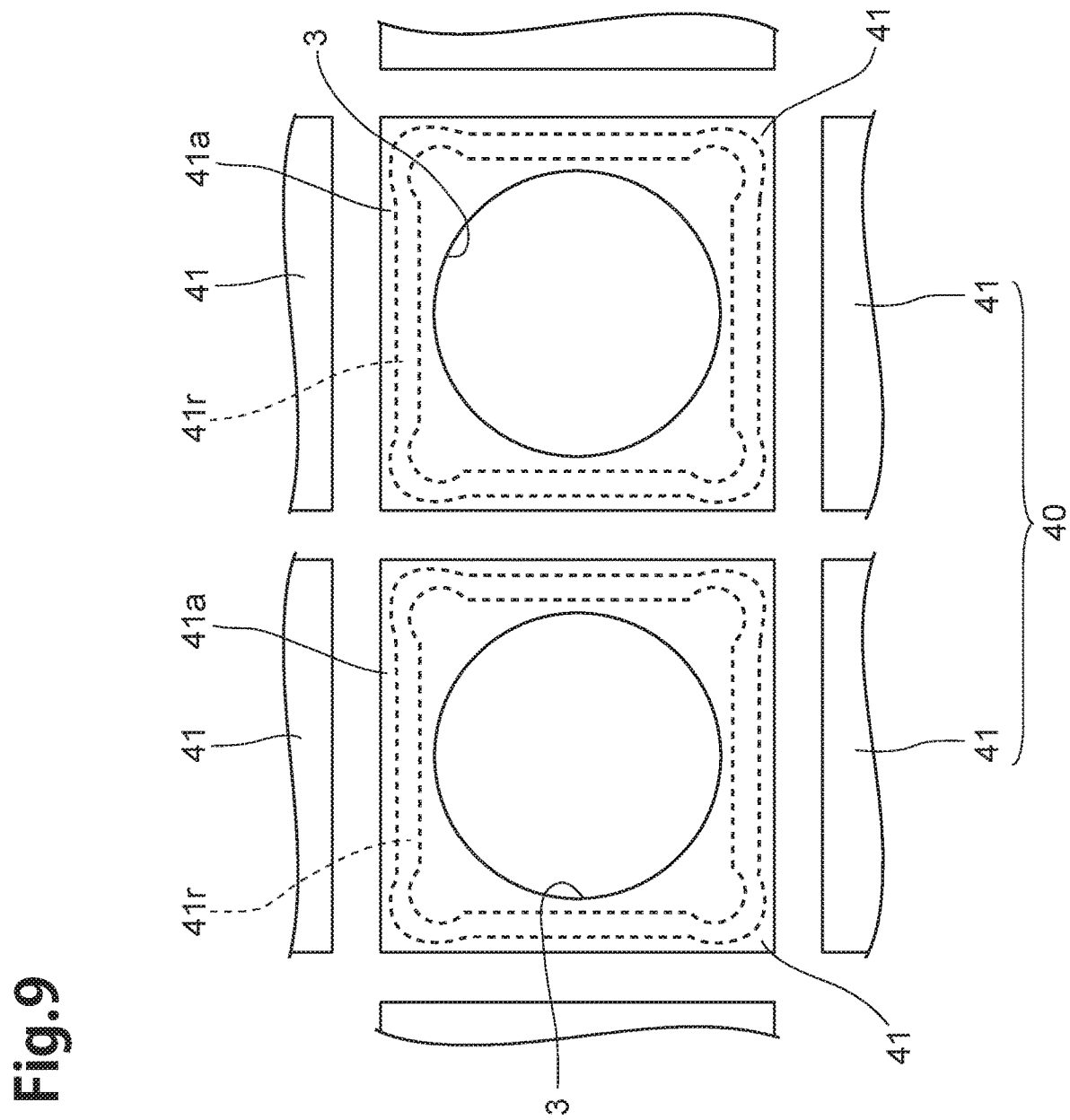
FIG. 9 is a plan view showing a principal part of the MEMS wafer with enlargement.
Figure 10:
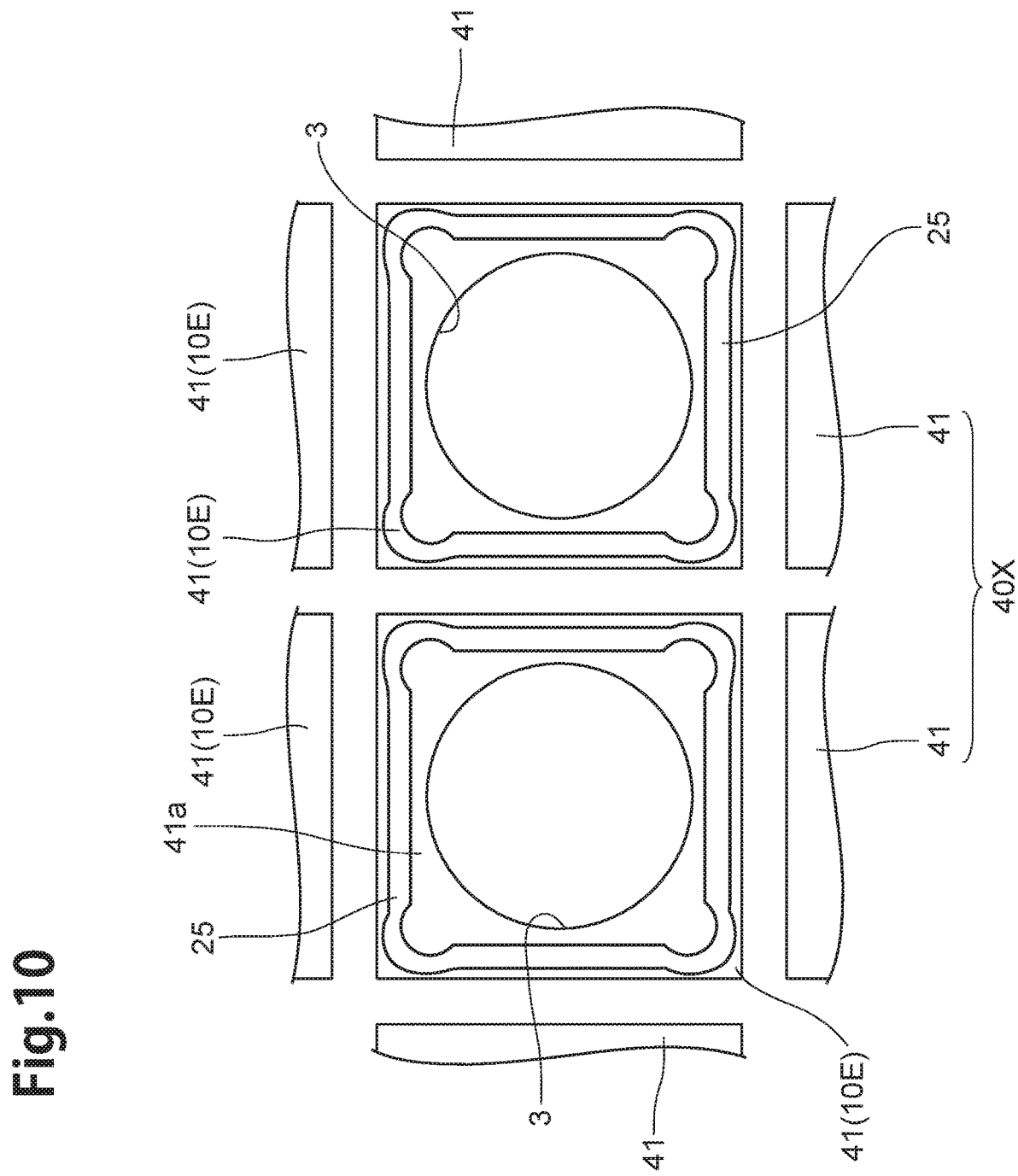
FIG. 10 is a plan view showing the manufacturing step of the MEMS package according to the embodiment of the present invention, corresponding to FIG. 9.
Figure 11:
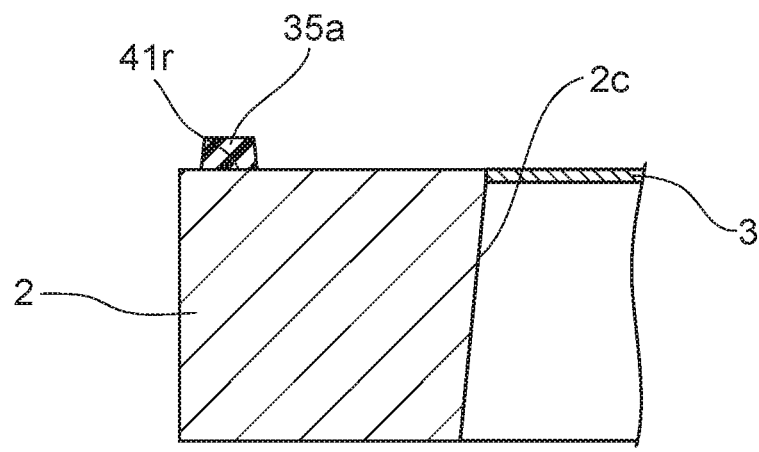
FIG. 11 (a) is a sectional view, partially omitted, showing a dam layer forming step, FIG. 11 (b) is a sectional view, partially omitted, showing the manufacturing step subsequent to that in FIG. 11 (a), FIG. 11 (c) is a sectional view, partially omitted, showing the manufacturing step subsequent to that in FIG. 11 (b)
Figure 11:
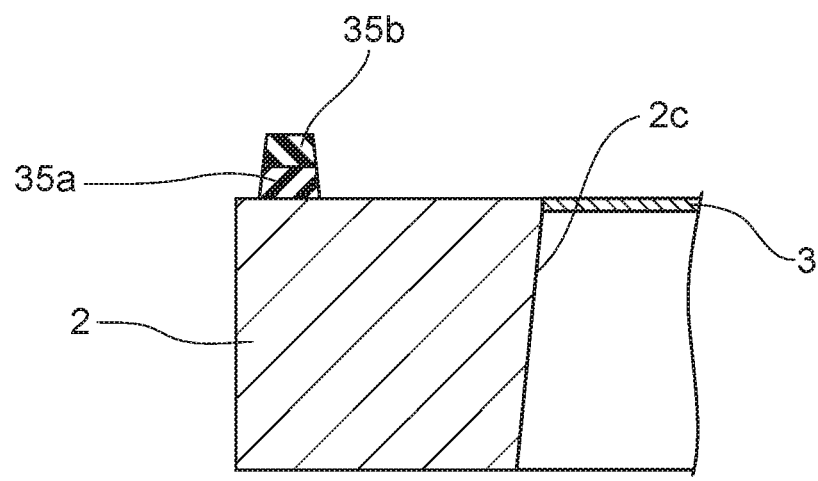
Figure 11:
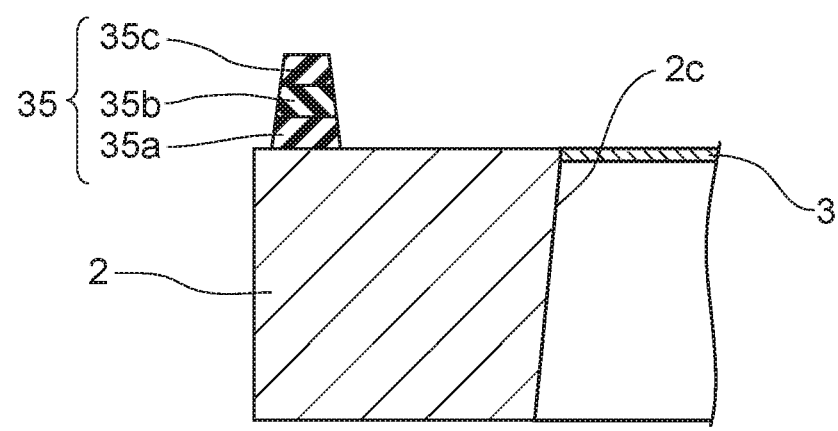
Figure 12:
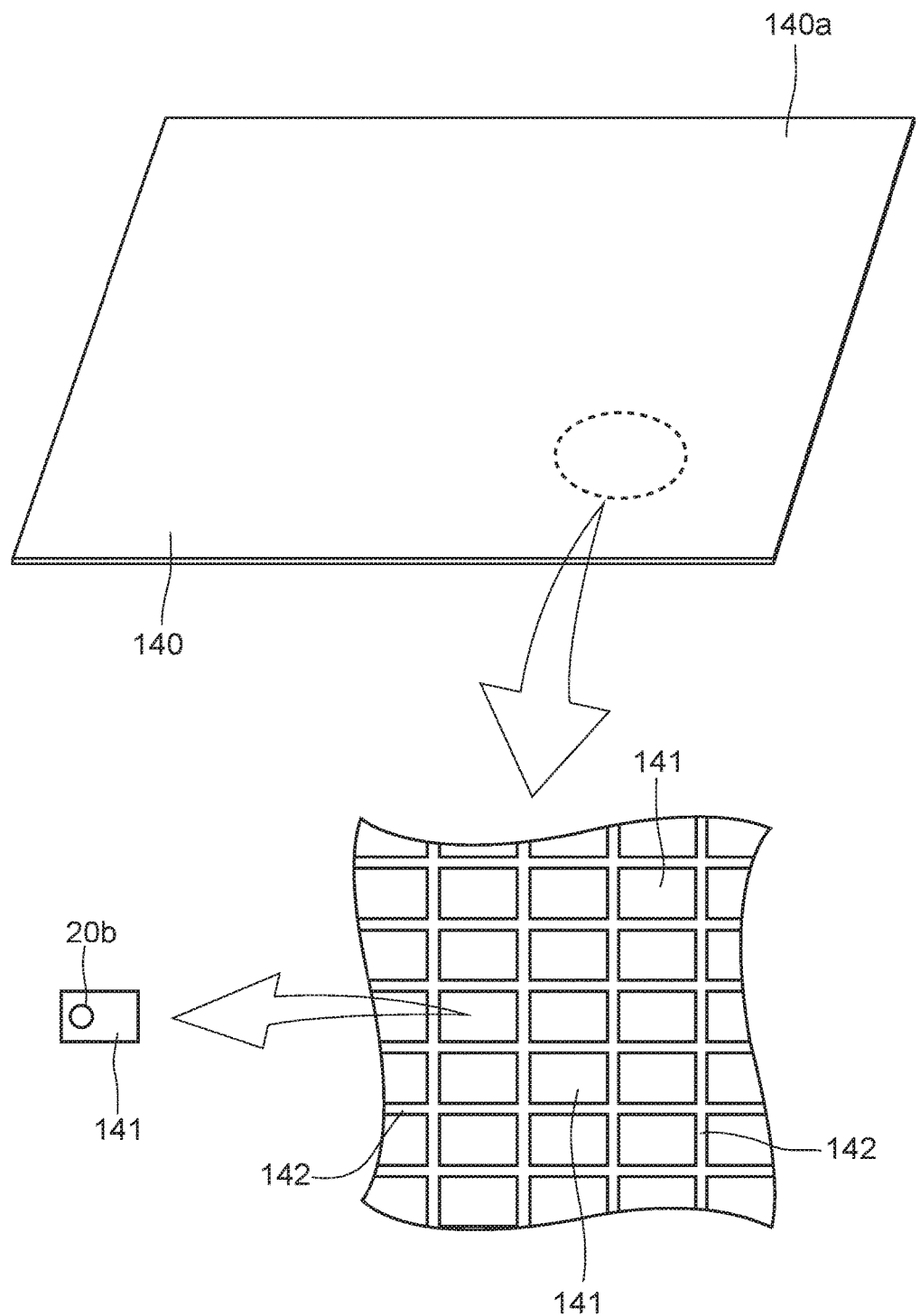
FIG. 12 is a perspective view showing a package-panel used for manufacturing method according to the embodiment of the present invention.
Figure 13:
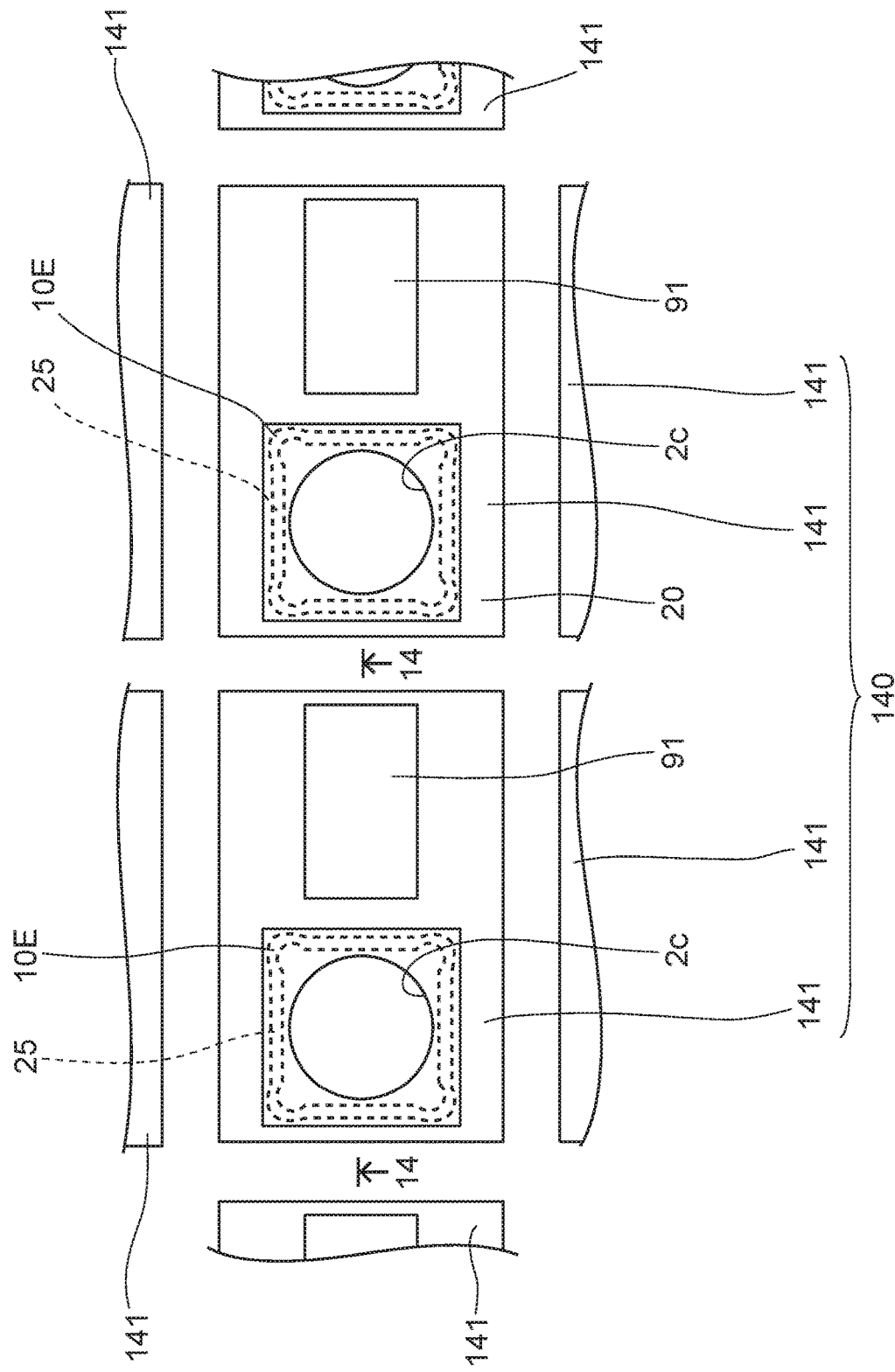
FIG. 13 is a plan view showing the manufacturing step subsequent to that in FIG. 10, showing a principal part of FIG. 12 with enlargement.
Figure 14:
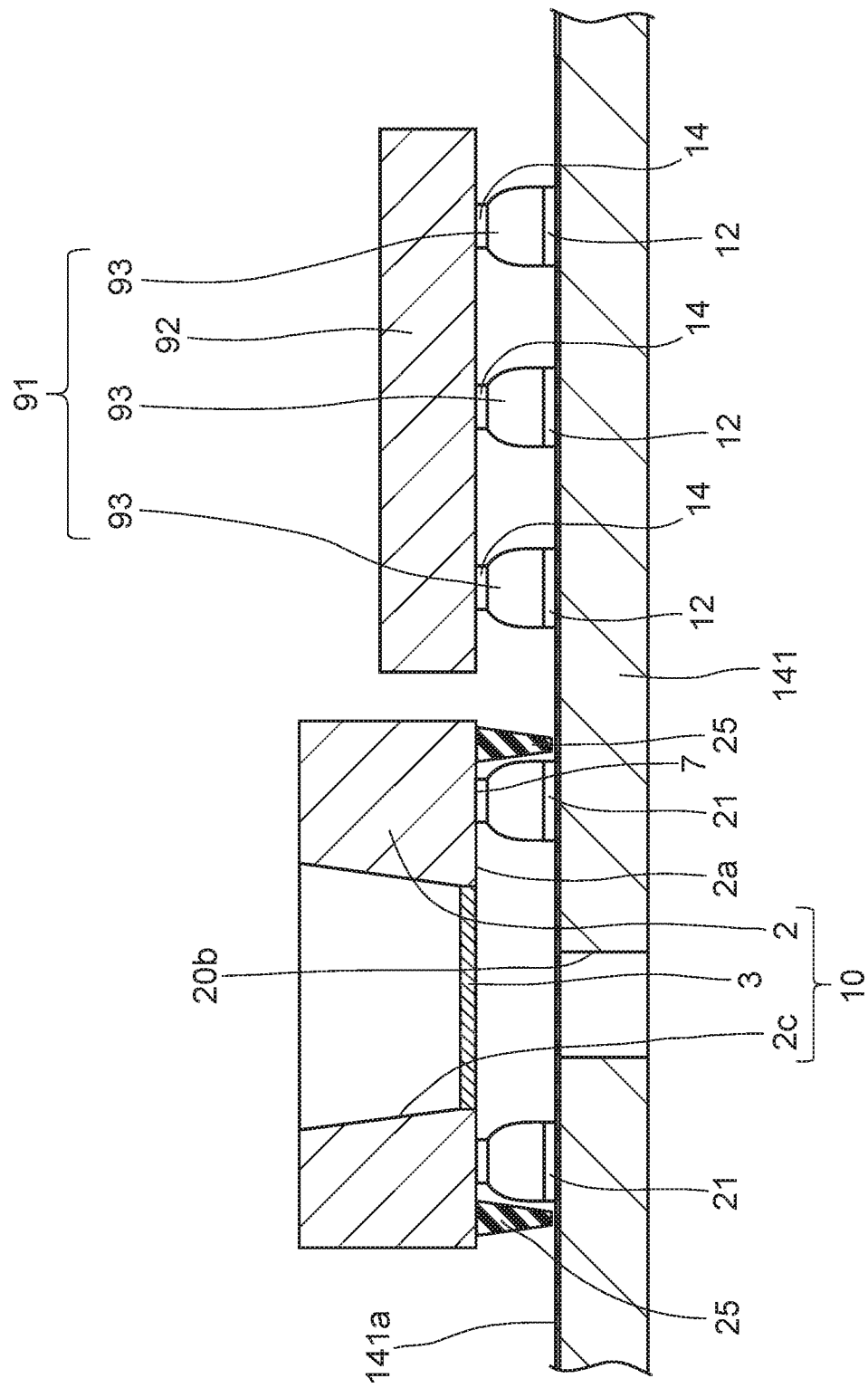
FIG. 14 is a sectional view, taken along the line 14-14 in FIG. 13, showing the manufacturing step subsequent to that in FIG. 10.
Figure 15:
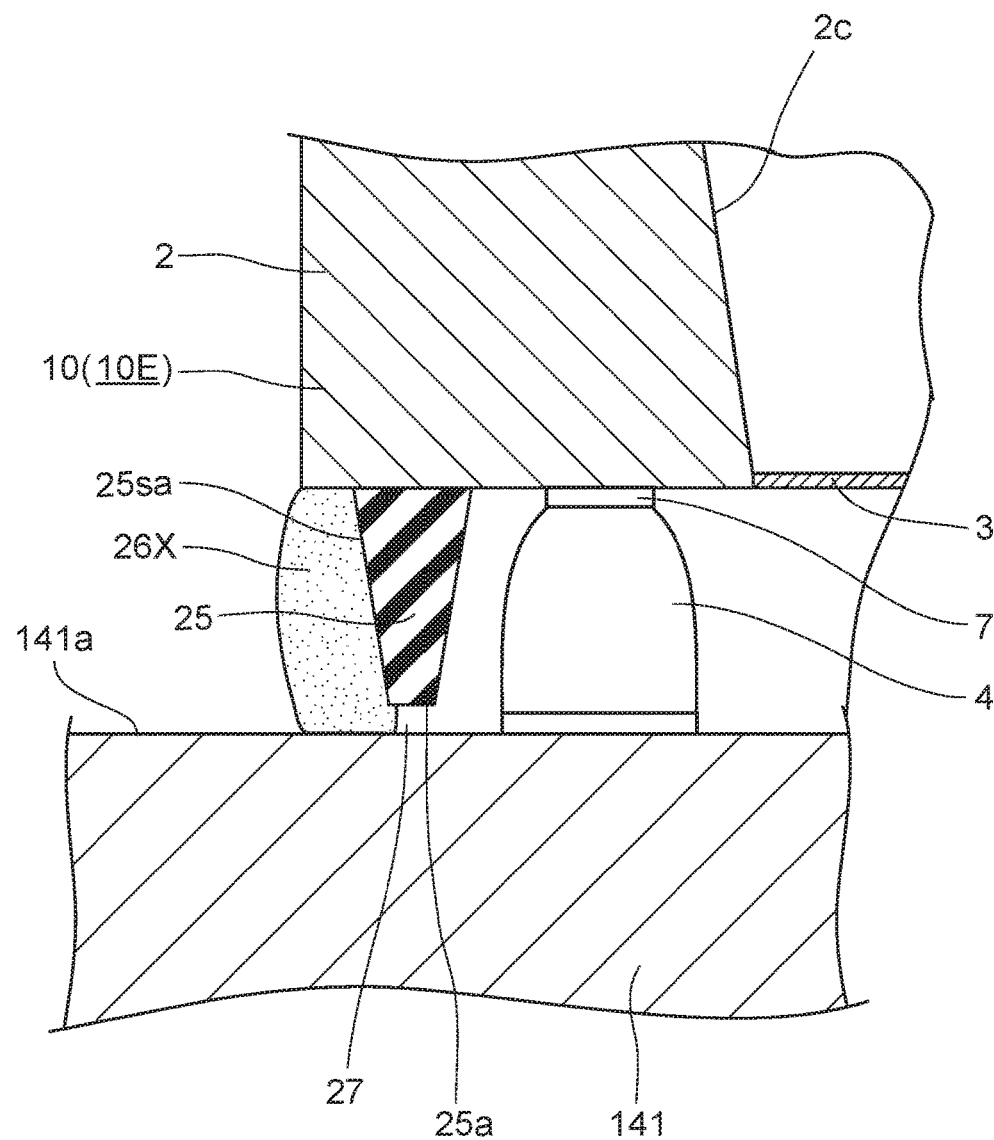
FIG. 15 is a sectional view, corresponding to FIG. 7, showing a gel member forming step.
Figure 16:
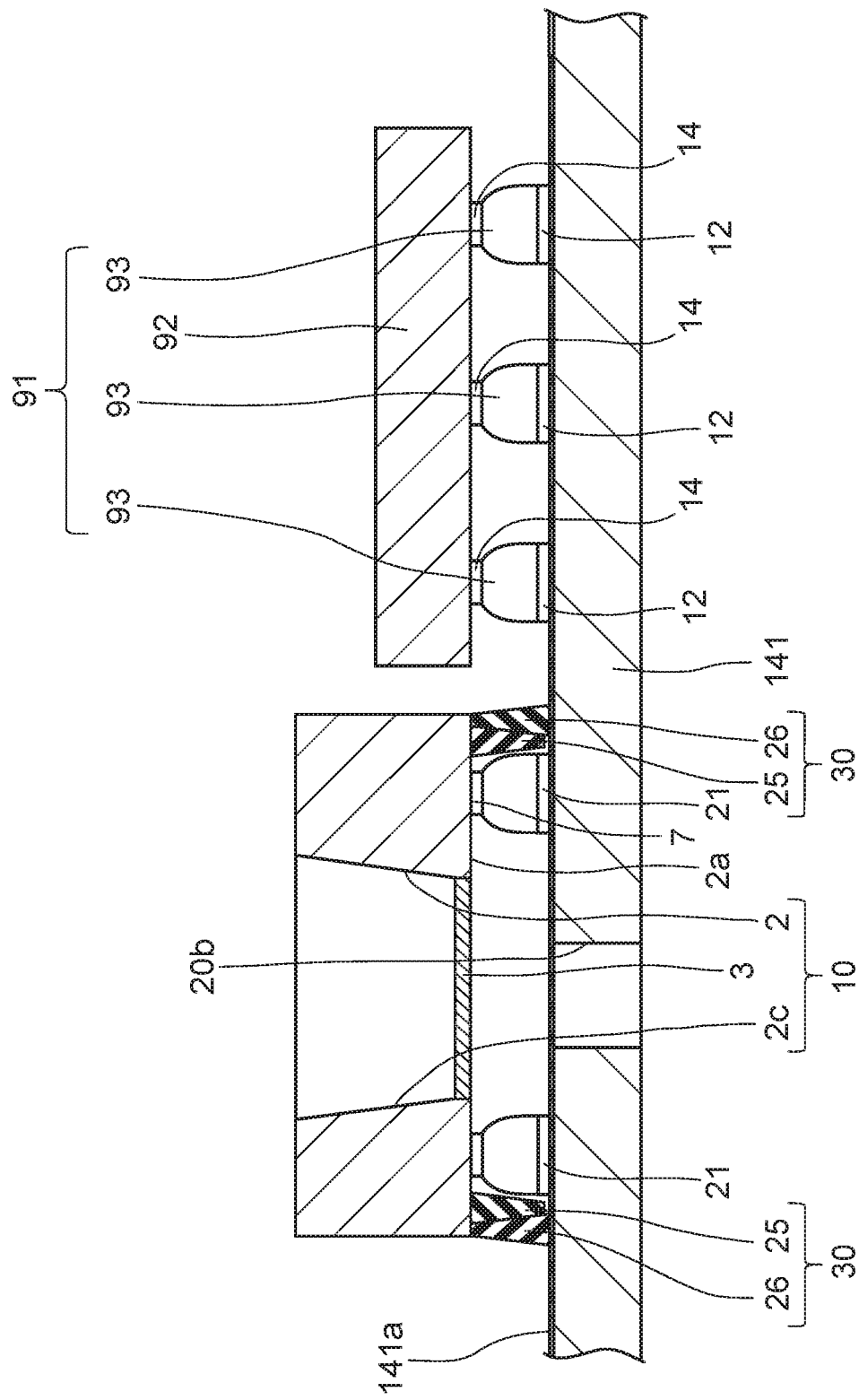
FIG. 16 is a sectional view showing the manufacturing step subsequent to that in FIG. 14, corresponding to FIG. 14.

Subsequently, the method of manufacturing the MEMS package 1 and the MEMS microphone 100, having the above-described structures, will be explained with reference to FIG. 8 to FIG. 16. Here, FIG. 8 is a perspective view showing a MEMS wafer 40, FIG. 9 is a plan view showing the principal part of the MEMS wafer 40 with enlargement. FIG. 10 is a plan view showing the manufacturing step of the MEMS package 1, corresponding to FIG. 9. FIGS. 11 (a), (b), (c) are sectional views, partially omitted, showing a dam layer forming step, FIG. 12 is a perspective view showing a package-panel 140. FIG. 13 is a plan view showing the manufacturing step subsequent to that in FIG. 10, showing a principal part of FIG. 12 with enlargement. FIG. 14 is a sectional view, taken along the line 14-14 in FIG. 13, showing the manufacturing step subsequent to that in FIG. 10. FIG. 15 is a sectional view, corresponding to FIG. 7, showing a gel member forming step. FIG. 16 is a sectional view showing the manufacturing step subsequent to that in FIG. 14, corresponding to FIG. 14.

In the method of manufacturing the MEMS package 1, the method of manufacturing the MEMS microphone 100, the above-described MEMS chip 10, the ASIC 92 and the package substrate 20 which the MEMS chip 10 and the ASIC 92 are adhered. The MEMS chip 10 is manufactured with the MEMS wafer 40, illustrated in FIG. 8. Further, the package substrate 20 is manufactured with the package-panel 140, illustrated in FIG. 12.

The MEMS wafer 40 is formed with a semiconductor wafer. As illustrated in FIG. 8, a plurality of MEMS regions 41 are formed on the MEMS wafer 40 by a uniform arrangement. The element hole-parts 2c and the membranes 3 are formed on the respective MEMS regions 41 (the element hole-part 2c and the membrane 3 are omitted in FIG. 8). As illustrated in FIG. 9, in the respective MEMS regions 41, the surfaces of the side, which the membranes 3 are formed, are element formed surfaces 41a. When the MEMS wafer 40 is divided along with scribe lines 42, the MEMS chip 10 is formed from each of the MEMS regions 41 (about 10,000-20,000 MEMS chips 10 are formed by every wafer).

As illustrated in FIG. 12, the package-panel 140 is a board-like member, having rectangular shape, made of PCB or ceramic, and a plurality of package regions 141 are formed on the surface 140a by a uniform arrangement. When the package-panel 140 is divided along with divided lines 142, the package substrate 20 is manufactured from each of the package regions 141 (about 600 package substrates 20 are manufactured by every package-panel 140). Further, in the package-panel 140, the sound holes 20b are formed in the respective package regions 141. Therefore, the package-panel 140 corresponds to a sound hole-panel of the present invention.

Then, an annular dam-member forming step, a MEMS chip manufacturing step, a mounting step, a gel member forming step and a panel cutting step are included in the method of manufacturing the MEMS package 1, the method of manufacturing the MEMS microphone 100. A cap mounting step is further included in the method of manufacturing the MEMS microphone 100. At first, the annular dam-member forming step is performed.

(Annular Dam-Member Forming Step)

In the annular dam-member forming step, the above-described annular dam-members 25 are formed. The annular dam-members 25 are formed on dam expected areas 41r of the respective MEMS regions 41, about the MEMS wafer 40. As illustrated in FIG. 9, the dam expected area 41r is an annular area (illustrated with broken line in FIG. 9) surrounding the whole of the membrane 3. The dam expected areas 41r are secured in the respective MEMS regions 41. Further, because the dam expected areas 41r are secured in the element formed surfaces 41a of the respective MEMS regions 41, the annular dam-members 25 are formed on the element formed surfaces 41a of the respective MEMS regions 41. The dam expected area 41r has the approximate rectangular shape in a plan view, similar with the dammed-seal part 30.

A dam layer forming step is included in the annular dam-member forming step. In the dam layer forming step, a dam layer is formed by an ink application and an ink hardening. In the ink application, ink is applied on the wafer (MEMS wafer 40, in this embodiment) by the ink jet system. In the ink hardening, ink, applied by the ink application, is hardened.

Figure 17:
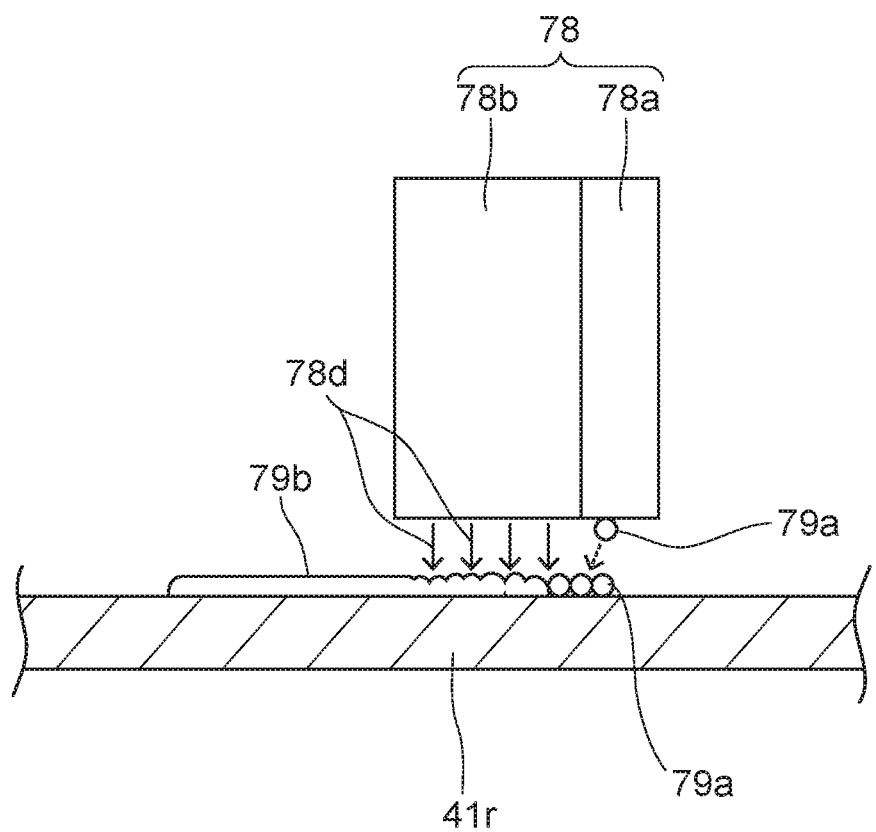
FIG. 17 is a side view showing a dam layer forming step using a printing hardening device.

In the dam layer forming step, for example, the dam layer is formed on the dam expected area 41r using a printing hardening device 78, illustrated in FIG. 17. The printing hardening device 78 has a printing head 78a and a light irradiation device 78b.

Then, when the printing hardening device 78 is used, minute ink drops 79a are discharged from the printing head 78a, and they are applied on the dam expected area 41r. Further, UV light irradiation 78d, by the light irradiation device 78b, is performed, works with the application of the ink drops 79a. Then, hardening the ink drops 79a is performed, thereby a hardened ink layer 79b is formed on the dam expected area 41r. The dam layer is formed from the hardened ink layer 79b.

In the method of manufacturing the MEMS package 1, the method of manufacturing the MEMS microphone 100, the above-described dam layer forming step is performed repeatedly, thereby a laminated dam layer is formed. The laminated dam layer is formed by laminating the dam layer.

The dam layer is formed by the above-described ink application and the ink hardening, after that the ink application and the ink hardening are performed again. Thereby another dam layer is formed on the dam layer which has been formed. Thereby, the laminated dam layer is formed.

For example, as illustrated in FIG. 11(a), at first, the dam layer 35a is formed on the dam expected area 41r, by the first dam layer forming step. Subsequently, as illustrated in FIG. 11(b), another dam layer 35b is formed on the dam layer 35a, which is already formed on the dam expected area 41r, by the second dam layer forming step. Further, as illustrated in FIG. 11(c), still another dam layer 35c is formed on the dam layer 35b, which is already formed on the dam expected area 41r, by the third dam layer forming step. In this way, the laminated dam layer 35 is formed by laminating the dam layers 35a, 35b, 35c.

In the method of manufacturing the MEMS package 1, the method of manufacturing the MEMS microphone 100, the above-described laminated dam layer 35 is formed, as the annular dam-member 25. Because the laminated dam layer 35 is formed as the annular dam-member 25, the annular dam-member 25 is formed in the predetermined thickness.

As described above, the annular dam-member forming step is performed, thereby, as illustrated in FIG. 10, the annular dam-members 25 are formed in the element formed surfaces 41a of the respective MEMS regions 41. Then, a dam-MEMS wafer 40X, which the annular dam-members 25 are formed in the respective MEMS regions 41, is manufactured.

(MEMS Chip Manufacturing Step)

Subsequently, the MEMS chip manufacturing step is performed. In the MEMS chip manufacturing step, the dam-MEMS wafer 40X is divided along with the scribe lines 42, thereby the dam-MEMS wafer 40X is cut into the respective MEMS regions 41. A dam-MEMS chip 10E is manufactured from each of the MEMS regions 41 (see FIG. 10 about the dam-MEMS chip 10E).

(Mounting Step)

Next, the mounting step is performed. In the mounting step, as illustrated in FIG. 13, FIG. 14, the dam-MEMS chips 10E and ASICs 91 are mounted by FCB on the respective package regions 141 of the package-panel 140. In this case, the sound holes 20b are formed in the respective package regions 141. The dam-MEMS chips 10E are mounted so that the annular dam-members 25 face to the package region 141 sides (package substrate 20 sides) and the annular dam-members 25 surround the sound hole 20b.

At this time, as illustrated in FIG. 15, the dam-MEMS chips 10E are mounted so that the dam spaces 27 are secured between the dam outer end surfaces 25a of the annular dam-members 25 and surfaces 141a of the package regions 141 (the surface 141a corresponds to the package surface 20a). The dam space 27 is a minute space which is arranged between the dam outer end surface 25a and the surface 141a of the package region 141. The dam space 27 is secured as a space which gel enters later.

(Gel Member Forming Step)

Subsequently, the gel member forming step is performed. In the gel member forming step, the gel members 26 are formed.

As described-above, the annular dam-members 25 are formed on the dam-MEMS chips 10E. Therefore, in the gel member forming step, as illustrated in FIG. 15, gels 26X of the predetermined amount are applied to the annular dam-members 25 from outside so that the gels 26X surround the annular dam-members 25. Because the gels 26X have fluidity at the time of being applied, the gels 26X move toward the surfaces 141a of the package regions 141 along with the outer dam slopes 25sa of the annular dam-members 25.

Figure 18:
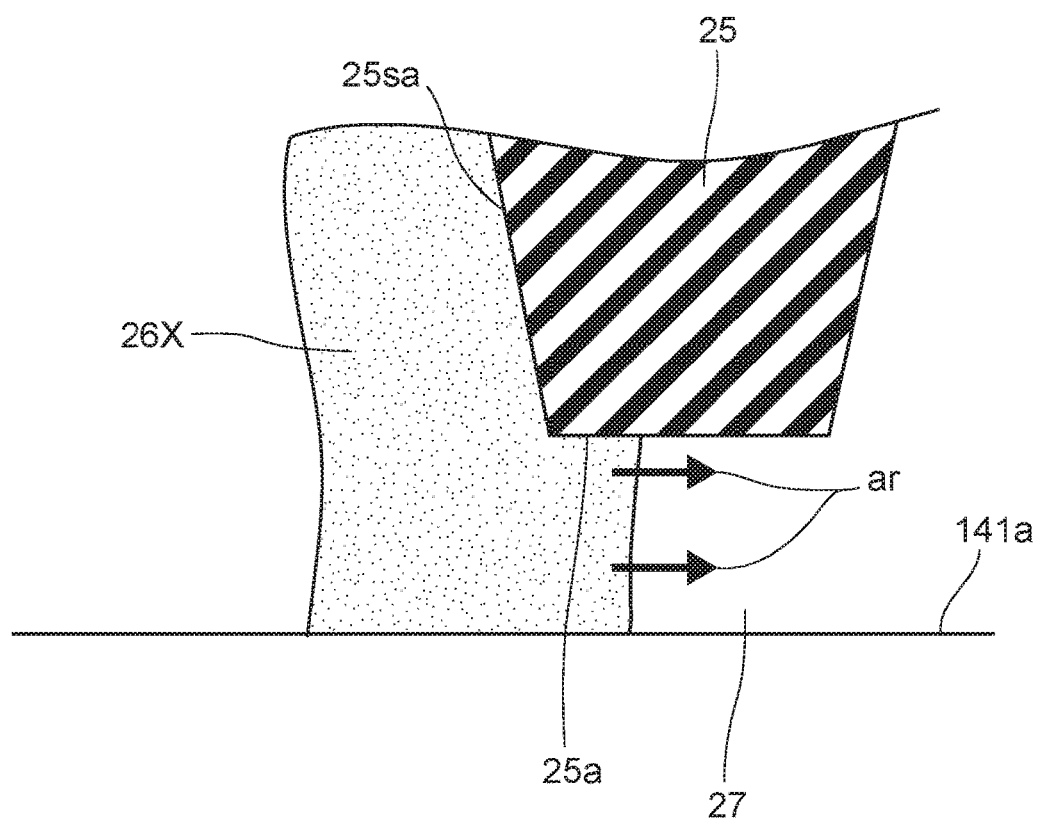
FIG. 18 is a sectional view, partially omitted, showing the gel member forming step, with enlargement.
Figure 19:
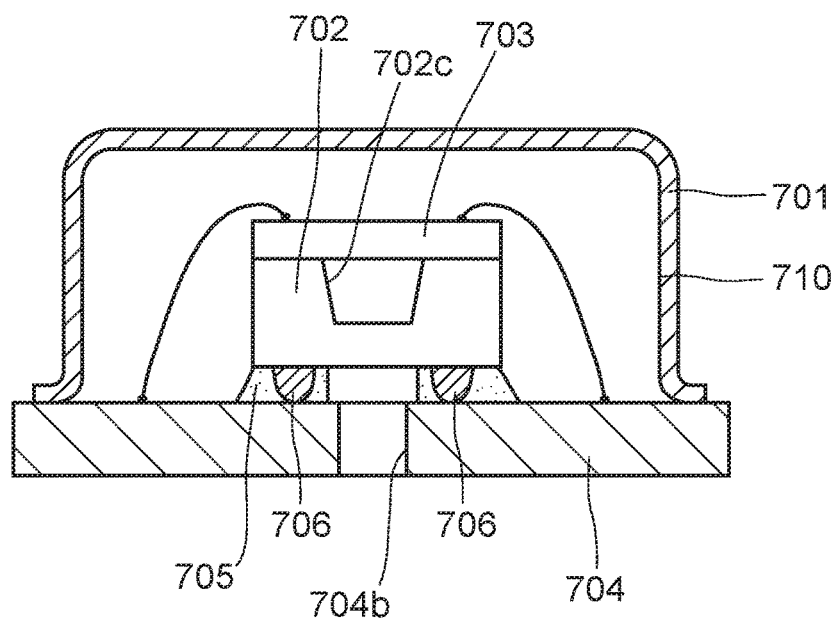
FIG. 19 is a sectional view showing the conventional MEMS microphone.
Figure 20:
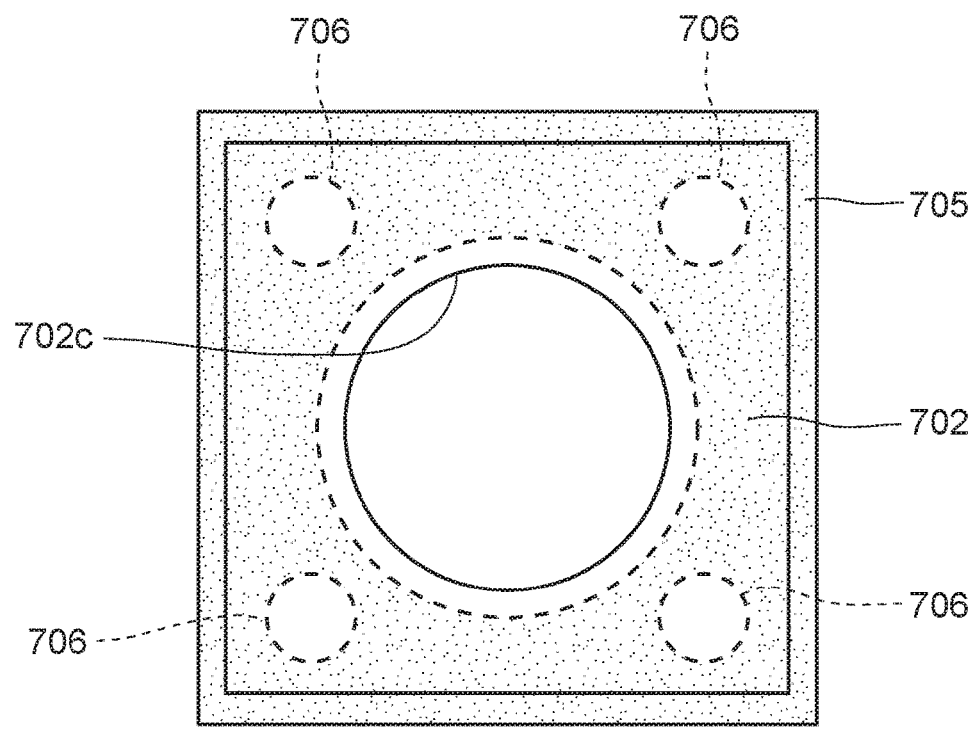
FIG. 20 is a sectional view showing the conventional MEMS microphone, different from that in FIG. 19.

At this time, the dam spaces 27 are secured between the dam outer end surfaces 25a of the annular dam-members 25 and the surfaces 141a. Therefore, as illustrated in FIG. 18, the gels 26X enter the dam spaces 27 from the outer dam slopes 25sa along with the direction shown by arrow ar. Therefore, parts of the gels 26X are cooped up in the dam spaces 27 so as not to move. After that, when the applied gels 26X are hardened by heating, UV light irradiation or the like, as illustrated in FIG. 16, the gel members 26 are formed. The gel members 26 are solidified with being supported by the annular dam-members 25, thereby the dammed-seal parts 30 are formed.

(Cap Mounting Step)

After that, the cap mounting step is performed. In the cap mounting step, the caps 99 are mounted on the respective package regions 141 of the package-panel 140.

(Panel Cutting Step)

After that, the panel cutting step is performed. In the panel cutting step, the package-panel 140, which the MEMS chips 10 (the dam-MEMS chips 10E) and the ASICs 92 are mounted, is cut along with the divided lines 142 to be divided into the respective package regions 141. Then, the package-panel 140 is divided into a plurality of the package regions 141. The MEMS package 1 and the MEMS microphone 100 are manufactured together with the package substrate 20 from each of the package regions 141.

(Operation and Effect of the MEMS Package, MEMS Microphone)

As mentioned above, the MEMS package 1 and the MEMS microphone 100 have the dammed-seal part 30. The dammed-seal part 30 has the annular dam-member 25 and the gel member 26, the gel member 26 is formed by hardening of gel which is applied on the annular dam-member 25 from outside.

Further, the gel member 26 is adhered to the opposing surface 2a so as to surround the whole of the membrane 3, and it also adhered to the package surface 20a so as to surround the whole of the sound hole 20b. Namely, the dammed-seal part 30 is a seal part which surrounds the sound hole 20b. The gel member 26 is formed by fluidity loss of gel caused by hardening. Then, gel having fluidity must to be applied on the MEMS chip 10 so that the gel member 26 is formed.

However, when gel having fluidity is applied on the opposing surface 2a of the MEMS chip 10, the gel is adhered to the membrane 3, thereby the membrane 3 is likely to be damaged. It is extremely difficult that the seal part, surrounds the membrane 3 and the sound hole 20b, is formed certainly with only gel having fluidity.

Then, in the MEMS package 1 and MEMS microphone 100, the annular dam-member 25 is formed on the opposing surface 2a so as to surround the membrane 3. Gel having fluidity is applied on the annular dam-member 25, the gel member 26 is formed by hardening of the gel.

In this case, the formation of gel, having fluidity, is maintained by the annular dam-member 25, having fixed structure. Because the gel member 26 is formed by hardening of gel, the dammed-seal part 30, which the annular dam-member 25 and the gel member 26 are united to one body, is obtained, at the moment when the gel member 26 is formed. Therefore, the seal part, which is adhered closely to the MEMS chip 10 and the package substrate 20, is manufactured certainly, from gel having fluidity. Therefore, the MEMS package 1 and the MEMS microphone 100 are able to be manufactured certainly.

Then, because the dammed-seal part 30 is formed so as to surround the all bonding bumps 4, the front volume is never narrowed by the dammed-seal part 30. Therefore, the MEMS package 1 and MEMS microphone 100 has a structure which the acoustic characteristic is not lowered.

Further, the annular dam-member 25 has the variable width structure. In the mounting step, the dam-MEMS chip 10E is mounted so that the annular dam-member 25 faces to the package substrate 20 side and the annular dam-member 25 surround the sound hole 20b. Therefore, when the gel is applied to the annular dam-member 25 (the MEMS chip 10 is arranged as illustrated in FIG. 15), about the width of the annular dam-member 25, the width of the package substrate 20 side is smaller than the width of the MEMS chip 10 side. Then, gel flows along with the outer dam slope 25sa, it is likely to get to the dam outer end surface 25a, as compared with the case which the width of annular dam-member 25 of the MEMS chip 10 side is equal to the width of the package substrate 20 side. Therefore, it is possible that the gel enters the dam space 27 certainly.

Accordingly, gel having fluidity is kept certainly, outflow of gel is surely prevented. Further, the gel member 26 is united closely with the annular dam-member 25 to form the dammed-seal part 30.

Further, the annular dam-member 25 is formed by performing the dam layer forming step repeatedly. Therefore, when the number of times for performing the dam layer forming step is changed, the size of the annular dam-member 25 is changed. Therefore, the annular dam-members, having various forms, are formed by the annular dam-member forming step. Further, because the dam layer is formed by the ink application and the ink hardening, the annular dam-member 25, having precise and minute form, is formed.

The type "double back-plate", having two not illustrated thin-films which are called back-plate are arranged in the upper side and the lower side of the membrane 3, is explained exemplarily in the embodiment. The present invention is also applicable to the type "single back-plate", having one back-plate is arranged in the one side of the membrane 3.

This invention is not limited to the foregoing embodiments but various changes and modifications of its components may be made without departing from the scope of the present invention. Besides, it is clear that various embodiments and modified examples of the present invention can be carried out on the basis of the foregoing explanation. Therefore, the present invention can be carried out in modes other than the above-mentioned best modes within the scope equivalent to the following claims.

What is claimed is:

1. A MEMS package comprising:
a MEMS chip; a package substrate which the MEMS chip is adhered; and a dammed-seal part,
wherein the MEMS chip comprises an element substrate which a movable element is formed,
wherein the package substrate comprises a sound hole,
wherein the dammed-seal part comprises an annular dam-member which is formed on the element substrate so as to surround the movable element, and a gel member,
wherein the MEMS chip is mounted on the package substrate so that the movable element opposes to the sound hole,
wherein the gel member is formed by hardening of gel which is applied on the annular dam-member from outside so as to surround the annular dam-member,
wherein the annular dam-member is formed on an opposing surface, opposing to the package substrate, of the element substrate,
wherein the opposing surface has an arrangement part, for the gel member, which is arranged in the outside than the annular dam-member,
wherein the gel member is formed on the arrangement part, and the gel member has a gel-outside surface which is not contact with the annular dam-member,
wherein the gel-outside surface is an exposed surface.

2. The MEMS package according to claim 1,
wherein the dammed-seal part is formed so as to seal the part between the MEMS chip and the package substrate, and so as to surround the sound hole.

3. A MEMS package comprising:
a MEMS chip; a package substrate which the MEMS chip is adhered; and a dammed-seal part,
wherein the MEMS chip comprises an element substrate which a movable element is formed,
wherein the package substrate comprises a sound hole,
wherein the dammed-seal part comprises an annular dam-member which is formed on the element substrate so as to surround the movable element, and a gel member,
wherein the MEMS chip is mounted on the package substrate so that the movable element opposes to the sound hole,
wherein the gel member is formed by hardening of gel which is applied on the annular dam-member from outside so as to surround the annular dam-member,
wherein the annular dam-member comprises a dam outer end surface, which is along with an opposing surface, of the element substrate, opposing to package substrate, a dam base surface, which is in contact with the opposing surface, a pair of dam slopes, which connects the dam outer end surface and the dam base surface, and a variable width structure in which the width gradually increases toward the dam base surface from the dam outer end surface.

4. The MEMS package according to claim 3,
wherein the gel member is in contact with both the dam outer end surface of the annular dam-member and an outer dam slope, arranged outside, of the pair of the dam slopes, and the gel member enters a dam space being formed between the dam outer end surface and the package substrate.

5. A MEMS microphone comprising:
a MEMS package; and a cap which wraps the MEMS package,
wherein the MEMS package comprises a MEMS chip, a package substrate which the MEMS chip is adhered, and a dammed-seal part,
wherein the MEMS chip comprises an element substrate which a movable element is formed,
wherein the package substrate comprises a sound hole,
wherein the dammed-seal part comprises an annular dam-member which is formed on the element substrate so as to surround the movable element, and a gel member,
wherein the MEMS chip is mounted on the package substrate so that the movable element opposes to the sound hole,
wherein the gel member is formed by hardening of gel which is applied on the annular dam-member from outside so as to surround the annular dam-member,
wherein the annular dam-member is formed on an opposing surface, opposing to the package substrate, of the element substrate,
wherein the opposing surface has an arrangement part, for the gel member, which is arranged in the outside than the annular dam-member,
wherein the gel member is formed on the arrangement part, and the gel member has a gel-outside surface which is not contact with the annular dam-member,
wherein the gel-outside surface is an exposed surface.

6. The MEMS microphone according to claim 5,
wherein the dammed-seal part is formed so as to seal the part between the MEMS chip and the package substrate, and so as to surround the sound hole,
wherein the MEMS microphone further comprising a front volume, which is surround by the movable element of the element substrate and the package substrate.

7. A MEMS microphone comprising:
a MEMS package; and a cap which wraps the MEMS package,
wherein the MEMS package comprises a MEMS chip, a package substrate which the MEMS chip is adhered, and a dammed-seal part,
wherein the MEMS chip comprises an element substrate which a movable element is formed,
wherein the package substrate comprises a sound hole,
wherein the dammed-seal part comprises an annular dam-member which is formed on the element substrate so as to surround the movable element, and a gel member,
wherein the MEMS chip is mounted on the package substrate so that the movable element opposes to the sound hole,
wherein the gel member is formed by hardening of gel which is applied on the annular dam-member from outside so as to surround the annular dam-member,
wherein the annular dam-member comprises a dam outer end surface, which is along with an opposing surface, of the element substrate, opposing to package substrate, a dam base surface, which is in contact with the opposing surface, a pair of dam slopes, which connects the dam outer end surface and the dam base surface, and a variable width structure in which the width gradually increases toward the dam base surface from the dam outer end surface,
wherein the gel member is in contact with both the dam outer end surface of the annular dam-member and an outer dam slope, arranged outside, of the pair of the dam slopes, and the gel member enters a dam space being formed between the dam outer end surface and the package substrate.

* * * * *